United States Patent
Ohannaidh

(10) Patent No.: US 8,212,616 B2
(45) Date of Patent: Jul. 3, 2012

(54) BIASING CIRCUIT FOR DIFFERENTIAL AMPLIFIER

(75) Inventor: Eoin Ohannaidh, Laval (FR)

(73) Assignee: STMicroelectronics SA, Montrouge (FR)

( * ) Notice: Subject to any disclaimer, the term of this patent is extended or adjusted under 35 U.S.C. 154(b) by 9 days.

(21) Appl. No.: 12/979,135

(22) Filed: Dec. 27, 2010

(65) Prior Publication Data

US 2011/0156816 A1    Jun. 30, 2011

(30) Foreign Application Priority Data

Dec. 28, 2009  (FR) ..................................... 09 59625

(51) Int. Cl.
*H03F 3/45* (2006.01)
(52) U.S. Cl. ........................ 330/261; 330/253
(58) Field of Classification Search .................. 330/253, 330/261
See application file for complete search history.

(56) References Cited

U.S. PATENT DOCUMENTS

| | | | |
|---|---|---|---|
| 5,699,014 A | * | 12/1997 | Haefner et al. ............... 330/261 |
| 6,275,109 B1 | * | 8/2001 | Tang ............................ 330/261 |
| 2008/0157875 A1 | | 7/2008 | Behzad et al. |

FOREIGN PATENT DOCUMENTS

| | | |
|---|---|---|
| DE | 196 39 034 A1 | 4/1998 |
| EP | 0 088 477 A1 | 9/1983 |
| GB | 2 248 148 A | 1/2007 |
| JP | 1 179507 | 7/1989 |

OTHER PUBLICATIONS

Republique Francaise, Institut National De La Propriete Industrielle, Rapport de Recherche Preliminaire (Preliminary Search Report) issued in French Patent Application No. FR 09-59625 on Sep. 21, 2010 (2 pages).

* cited by examiner

*Primary Examiner* — Khanh Nguyen
(74) *Attorney, Agent, or Firm* — Slater & Matsil, L.L.P.

(57) ABSTRACT

The invention concerns a biasing circuit for controlling the current flowing through a differential pair (102, 104) comprising: a first branch comprising a first resistor (306), a first transistor device (308) and a second transistor device (310) coupled in series; a second branch comprising a second resistor (312), a third transistor device (314) and a fourth transistor device (316) coupled in series, a control node of the third transistor device being coupled to a first node (324) between the first resistor and the first transistor device, and a control node of the first transistor device being coupled to a second node (322) between the second resistor and the third transistor device; and an operational amplifier (318) having an output node coupled to control nodes of the second and fourth transistor devices, said output node providing a output signal (Vc) for controlling the current flowing through said differential pair.

20 Claims, 3 Drawing Sheets

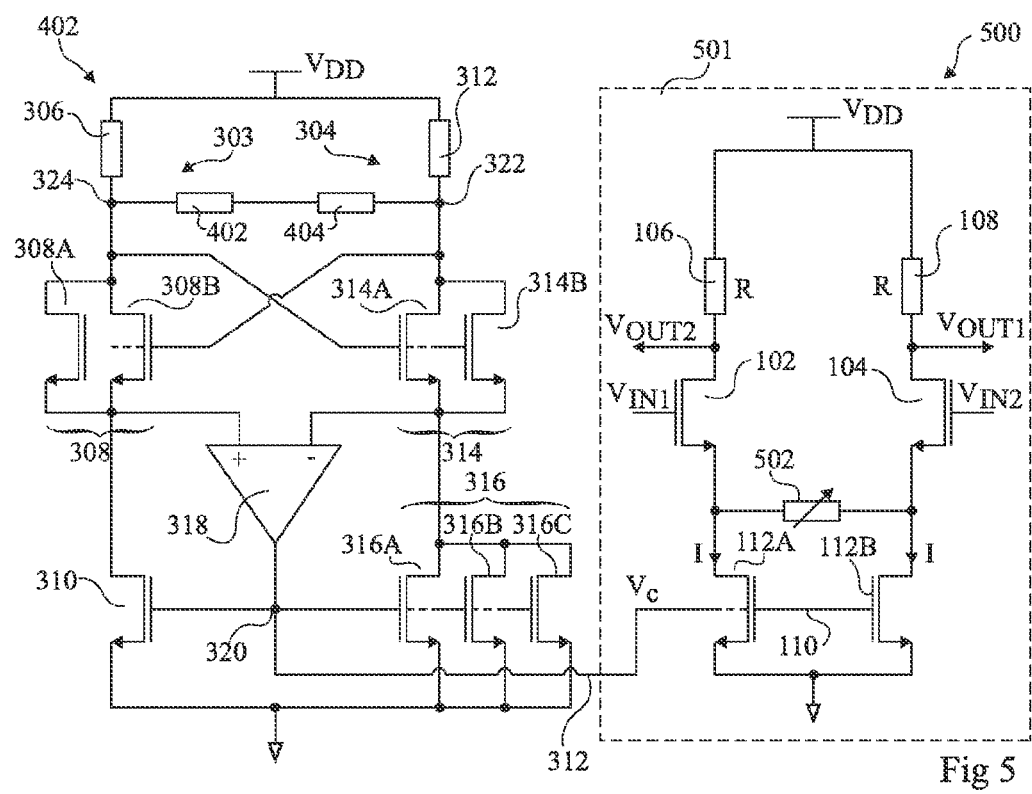
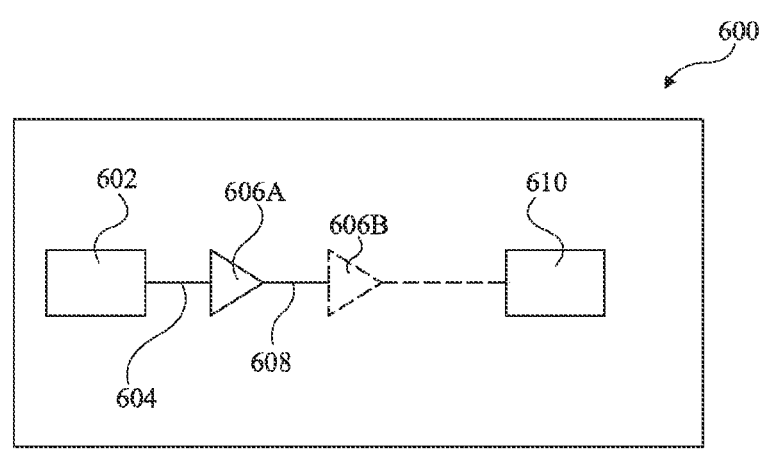

BIASING CIRCUIT FOR DIFFERENTIAL AMPLIFIER

This application claims the benefit of French Patent Application No. 09-59625, filed on Dec. 28, 2009, entitled "Biasing Circuit For Differential Amplifier," which application is hereby incorporated herein by reference.

TECHNICAL FIELD

The present invention relates to a biasing circuit for a differential amplifier, and in particular to a biasing circuit for controlling the current passing through a differential pair of a differential amplifier.

BACKGROUND OF THE INVENTION

FIG. 1 illustrates amplifying circuitry 100 comprising a differential amplifying circuit 101. Circuit 101 comprises a differential pair of transistors 102, 104, receiving at their gates differential input voltages $V_{IN1}$ and $V_{IN2}$ respectively. Transistor 102 of the differential pair is for example a MOS transistor having its drain coupled to a high supply voltage $V_{DD}$ via a resistor 106, while transistor 104 is for example a MOS transistor having its drain coupled to $V_{DD}$ via a resistor 108. Transistors 102, 104 have their sources coupled together by a line 110. A current source 112 is provided between the sources of transistors 102, 104 and ground, and comprises first and second transistors 112A and 112B.

The differential amplifying circuit 101 provides differential output signals $V_{OUT2}$ and $V_{OUT1}$ on output lines 114 and 116 respectively coupled to the drains of transistors 102, 104. The gain of the amplifier is determined by the trans-conductance "GM" of the transistors 102 and 104, and the resistance R of each of the resistors 106, 108. In particular, the gain is equal to GM×R.

During operation of the differential amplifier 100, the gain may depart from expected values due to temperature and/or process variations that cause variations in the values of GM and R. This is undesirable in many applications of the amplifier 100, as too much gain can cause linearity problems, for example the output signal swing being too large for circuit capabilities, and too little gain can cause noise problems, for example the output signal swing not being significantly larger than noise generated by the circuit.

One solution for overcoming this disadvantage would be to replace the resistors 106 and 108 by transistors. Then, variations in the transconductance GM would be compensated, leading to a more constant gain. However, a problem with such a solution is that these transistors would have a drain source voltage drop higher than the voltage drop across the resistors 106, 108. Thus to maintain the same output voltage, a higher supply voltage would be needed, which is a problem due to the general trend in the industry to reduce supply voltages.

As shown in FIG. 1, an alternative solution is to control the current source 112 such that the total current 2I through the current source 112 varies to counteract variations in the resistance R and transconductance GM. A biasing circuit 117 is used to control the current source 112, and comprises a transistor 118 coupled in series with a variable current source 120. The current I flowing through the variable current source 120 matches the current I flowing through each of the transistors 112A, 112B of the variable current source 112.

However, there is a difficulty in designing the variable current source 120 to accurately match both R and GM variations occurring in the components 102, 104, 106 and 108 of the differential amplifying circuit 101. There is thus a need for a differential amplifier having a biasing circuit that effectively controls the current source 112.

SUMMARY OF THE INVENTION

In one aspect, the present invention provides for a biasing circuit for controlling the current flowing through a differential pair of a differential amplifying circuit. The biasing circuit comprises first and second branches each coupled between first and second supply voltages. The first branch comprises a first resistor, a first transistor device and a second transistor device coupled in series, and the second branch comprises a second resistor, a third transistor device and a fourth transistor device coupled in series. The circuit further includes a control node of the third transistor device being coupled to a first node between the first resistor and the first transistor device, and a control node of the first transistor device being coupled to a second node between the second resistor and the third transistor device. The circuit further includes an operational amplifier. The operational amplifier has having a first input coupled to a node between the first and second transistor devices, a second input coupled to a node between the third and fourth transistor devices, and an output node coupled to control nodes of the second and fourth transistor devices. The output node provides an output signal for controlling the current flowing through the differential pair.

In another aspect, the present invention provides for a device comprising an input configured to receive an input signal and a biasing circuit configured to control a differential pair of a differential amplifier. The biasing circuit has first and second branches each coupled between first and second supply voltages. The first branch comprises a first resistor, a first transistor device and a second transistor device coupled in series, and the second branch comprises a second resistor, a third transistor device and a fourth transistor device coupled in series. A control node of the third transistor device is coupled to a first node between the first resistor and the first transistor device, and a control node of the first transistor device is coupled to a second node between the second resistor and the third transistor device. The biasing circuit further includes an operational amplifier having a first input coupled to a node between the first and second transistor devices, a second input coupled to a node between the third and fourth transistor devices, and an output node coupled to control nodes of the second and fourth transistor devices. The output node provides an output signal for controlling the current flowing through the differential pair. The device further includes the differential amplifier, which is configured to receive and amplify the input signal. The differential amplifier includes a first resistor coupled between the first supply voltage and a first transistor of the differential pair, and a second resistor coupled between the first supply voltage and a second transistor of the differential pair. The differential amplifier further includes a variable current source controlled by the output signal for controlling the current flowing through said differential pair. The device also includes an output configured to output the amplified input signal.

In yet another embodiment, the present invention provides for an electronic device comprising a differential amplifier having a first input connected to a first node and a second input connected to a second node and having an output driving a variable current signal to a differential pair of a differential amplifier. The said first node is connected to (i) a first transistor, the first transistor having a first terminal connected to a first supply voltage through a first resistor and (ii) a second transistor having a control terminal connected to said output. The said second node is connected to (i) a third transistor, the third transistor having a first terminal connected to the first supply voltage through a second resistor and (ii) a plurality of fourth transistors, each of which has a control node connected to the output.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 to 5 illustrates schematically differential amplifiers comprising biasing circuits according to embodiments of the present invention; and FIG. 6 illustrates schematically an electronic device according to an embodiment of the present invention.

Throughout the figures, like features have been labelled with like reference numerals.

DETAILED DESCRIPTION OF ILLUSTRATIVE EMBODIMENTS

Figure 1:
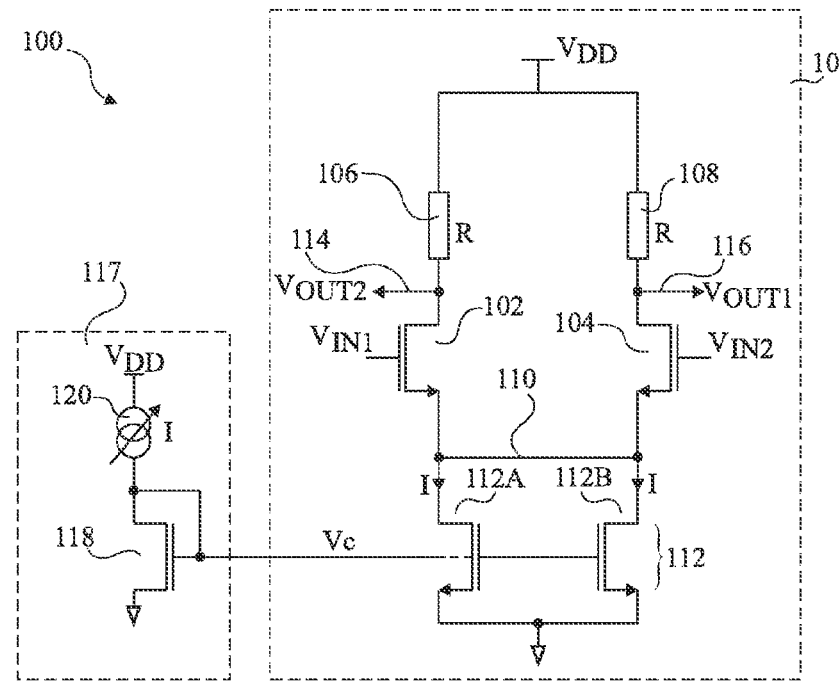
FIG. 1 (described above) illustrates schematically a differential amplifier.

Before describing the illustrated embodiments in detail, the various embodiments and advantages thereof will be described in general terms. It is an aim of embodiments of the present invention to at least partially address one or more needs in the prior art. According to one aspect of the present invention, there is provided a biasing circuit for controlling the current flowing through a differential pair of a differential amplifying circuit, the biasing circuit comprising: first and second branches each coupled between first and second supply voltages, the first branch comprising a first resistor, a first transistor device and a second transistor device coupled in series, and the second branch comprising a second resistor, a third transistor device and a fourth transistor device coupled in series, a control node of the third transistor device being coupled to a first node between the first resistor and the first transistor device, and a control node of the first transistor device being coupled to a second node between the second resistor and the third transistor device; and an operational amplifier having a first input coupled to a node between the first and second transistor devices, a second input coupled to a node between the third and fourth transistor devices, and an output node coupled to control nodes of the second and fourth transistor devices, said output node providing a output signal for controlling the current flowing through said differential pair.

According to one embodiment, the first and second transistor devices each comprise a pair of transistors coupled in parallel. According to another embodiment, the transistor of the first and third transistor devices each have the same width as each transistor of said differential pair.

According to another embodiment, the fourth transistor device comprises a plurality of transistors coupled in parallel with each other, each having the same width as a transistor of said variable current source. According to yet another embodiment, the ratio between the number of transistors of said fourth transistor device and of said second transistor device is chosen to equal $(N+1)/(N-1)$, where N is the ratio between a quiescent current and a maximum acceptable signal current.

According to another embodiment, the ratio between the number of transistors of said fourth transistor device and of said second transistor device is in the range 1 to 20, or for example in the range 1.2 to 20. According to still another embodiment, the biasing circuit further comprises at least one resistor coupled between said first and second nodes. According to another embodiment, the fourth transistor device comprises three transistors coupled in parallel with each other, each having a width equal to the width of the transistors of the second transistor device of the first branch.

According to another aspect of the present invention, there is provided a differential amplifier comprising the above biasing circuit, and an amplifying circuit comprising a first resistor coupled between the first supply voltage and a first transistor of the differential pair, a second resistor coupled between the first supply voltage and a second transistor of the differential pair; and a variable current source controlled by said output signal for controlling the current flowing through said differential pair.

According to one embodiment, the amplifying circuit comprises a first differential output node between the first transistor of the differential pair and the first resistor, and a second differential output node between the second transistor of the differential pair and the second resistor. According to another embodiment, the amplifying circuit further comprises a first variable resistor coupled between the sources of the first and second transistors of the differential pair, and wherein the variable current source comprises: a first transistor coupled between the source of the first transistor of the differential pair and the second supply voltage; and a second transistor coupled between the source of the second transistor of the differential pair and the second supply voltage.

According to another aspect of the present invention, there is provided a variable gain amplifier comprising the above differential amplifier. According to yet another aspect of the present invention, there is provided an electronic device comprising the above differential amplifier. According to still another aspect of the present invention, there is provided a disk drive for reading an electronic data storage disk comprising a reading head and the above differential amplifier.

According to another aspect of the present invention, there is provided an amplifier comprising a plurality of the above differential amplifiers coupled in series. According to one embodiment, the first, second, third and fourth transistor devices of the biasing circuit, and the differential pair of the amplifying circuit, each comprise MOS transistors.

Figure 2:
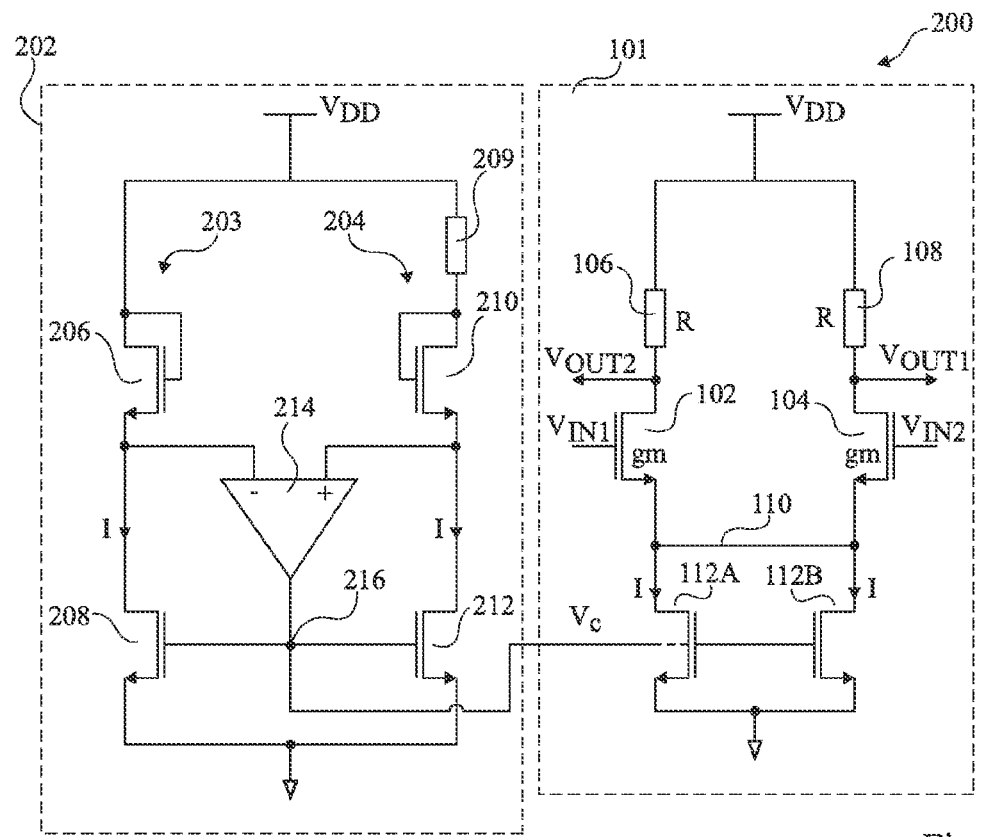
FIG. 2 illustrates schematically a differential amplifier comprising a biasing circuit according to one example.

FIG. 2 illustrates a differential amplifier 200 comprising an amplifying circuit 101, which is the same as that of FIG. 1, and will not be described again in detail. FIG. 2 also illustrates an example of a possible biasing circuit 202 for controlling the variable current source 112 of the amplifying circuit 101.

Biasing circuit 202 comprises branches 203 and 204. Branch 203 comprises MOS transistors 206 and 208 arranged in series between a supply voltage $V_{DD}$ and ground. Branch 204 comprises a resistor 209, a MOS transistor 210 and a MOS transistor 212 coupled in series between $V_{DD}$ and ground. The transistors 206 and 210 have their gates coupled to their drains. The sources of transistors 206 and 210, in addition to being coupled respectively to drains of transistors 208 and 212, are also coupled to respective inputs of an operational amplifier 214. The output of the operational amplifier 214 is coupled to a node 216, which is in turn coupled to the gates of transistors 208 and 212, and to the variable current source 112 of the amplifying circuit 101.

In operation, the biasing circuit 202 of FIG. 2 is designed with the aim of maintaining a reasonably constant GM×R, for any variations in the resistance of resistors 106, 108 and in the transconductance GM of the differential pair 102, 104 resulting from temperature or process variations. For this, assuming an approximation based on a square-law equation (see below), the width of transistor 210 is chosen to be four times that of transistor 206. Transistors 208 and 212 have the same width as each other, matching the width of the transistor 112 of the variable current source. The current in both branches 203 and 204 is of a constant value I, and current I should equal the current flowing through the variable current source 112 of the amplifying circuit 101. Thus, calling the voltage across transistor 206 $V_{GS1}$, the voltage across transistor 210 $V_{GS2}$, and the resistance of resistor 209 R, it follows that:

$$V_{DD} - V_{GS1} = V_{DD} - IR - V_{GS2}$$

The current $I_{DS}$ through transistor 210 is approximated based on the following square-law equation:

$$I_{DS} = (kW/2L)\Delta V_{GS}^2 \qquad (1)$$

where $\Delta VGS$ is the source-gate voltage minus the MOS threshold voltage, k is a MOS parameter, W is the transistor width and L is the channel length. Thus, it follows that $\Delta V_{GS1} = IR + \Delta V_{GS2}$, and given that the width of transistor 210 is four times that of transistor 206, $\Delta V_{GS1} = 2\Delta V_{GS2}$ and thus $2\Delta V_{GS2} = IR$. Calling the transconductance of transistor 206 gm, the transconductance of transistor 210 is thus 2 gm, and as $gm = 2I/\Delta V_{GS}$, it follows that $gm \times R = 1$.

One drawback of the biasing circuit 202 is that certain parasitic values of components in the biasing circuit are not well matched to those of the differential amplifier. In particular, because transistor 210 has a width four times that of transistor 206, it is not possible to have both transistors 206 and 210 well matched with transistors 102, 104 of the differential pair.

Furthermore, the biasing circuit 202 is based on the square law of equation (1) above, whereas in practise the present inventor has found that this is no longer accurate for today's CMOS technology.

Figure 3:
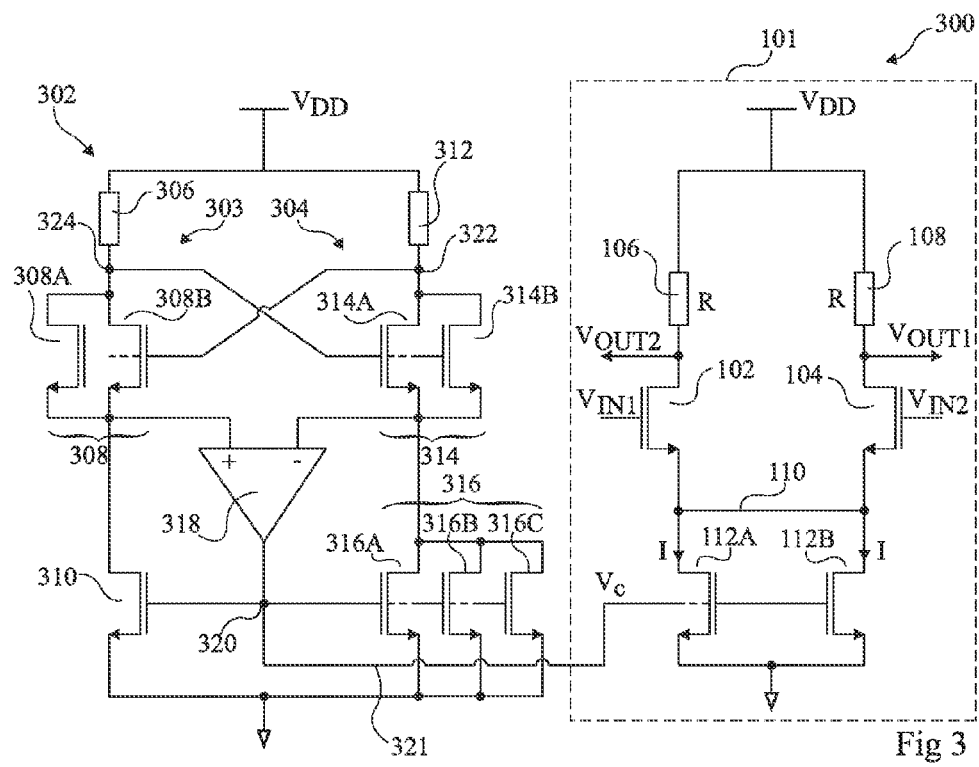

FIG. 3 illustrates a differential amplifier 300, which again comprises the amplifying circuit 101 of FIG. 1, comprising the differential pair 102, 104 and other components 106 to 112 described above in relation to FIG. 1. Furthermore, a biasing circuit 302 is provided for controlling the variable current source 112 of the amplifying circuit 101. The biasing circuitry 302 comprises a pair of branches 303, 304 coupled between a supply voltage $V_{DD}$ and ground.

Branch 303 comprises a resistor 306, a MOS device 308 and a MOS device 310 coupled in series. The MOS device 308 comprises a pair of MOS transistors 308A, 308B coupled in parallel, and in particular having their sources, drains and gates coupled together, while in this example the transistor device 310 is formed of a single transistor. The resistor 306 is coupled between the supply voltage $V_{DD}$ and the drains of each of the transistors 308A, 308B.

Branch 304 comprises a resistor 312, a MOS device 314 and a MOS device 316 coupled in series. The MOS device 314 comprises a pair of MOS transistors 314A, 314B coupled in parallel. The MOS device 316 comprises three MOS transistors 316A, 316B, 316C coupled in parallel. Resistor 312 is coupled between the supply voltage $V_{DD}$ and the drains of transistors 314A, 314B.

The gate and drains of transistors 308A, 308B and 314A, 314B are cross-coupled. In other words, the gates of transistors 308A, 308B are coupled to a node 322 between the drains of transistor 314A, 314B and resistor 312, while the gates of transistor 314A, 314B are coupled to a node 324 between the drains of transistor 308A, 308B and resistor 306. The sources of transistors 308A, 308B and 314A, 314B, in addition to being coupled respectively to the drains of transistor 310 and transistors 316A, 316B and 316C are coupled to respective differential inputs of an operation amplifier 318. The output of the operational amplifier 318 is coupled to a node 320, which is in turn coupled to the gates of transistors 310, 316A, 316B and 316C and to the variable current source 112. In particular, node 320 is coupled via a line 321 to the gate of transistors 112A, 112B of the amplifying circuit 101.

The transistors 308A, 308B and 314A, 314B are for example all the same length and width as each other, and each of the transistors 316A, 316B, 316C for example has the same length and width as transistor 310.

In some embodiments there is a scaling factor of M/N between the current 2I in the differential amplifying circuit 101 and the combined current through the branches 303, 304 of the biasing circuit 302. Thus there is for example also a scaling factor of M/N between the width of each transistor 102, 104 of the differential pair and the combined width of the transistors of each device 308, 314. Likewise, there is a scaling factor of M/N between the combined width of the transistors 112A, 112B of the current source 112, and the combined width of the transistors of devices 310 and 316 of the biasing circuit 302. Thus for example, each transistor 102, 104 of the differential pair has a width equivalent to M times that of each transistor of devices 308, 314, while each transistor 112 of the current source has a width equivalent to M times that of each transistor of devices 310, 316.

Similarly, there is for example a factor of N/M between the resistance of resistors 106, 108, and the resistance of resistors 306 and 312. Thus resistors 106, 108 each have a resistance R/M, while resistors 306, 312 each have a resistance R/N. For example, resistors 106 and 108 have a resistance of between 1 kΩ and 100 kΩ, although other values are possible.

As an example, in the case that M is 4 and N is 2, transistors 308A, 308B, 314A, 314B are each one quarter of the width of each transistor 102, 104, and transistors 310, 316A, 316B and 316C are each one quarter of the width of each transistor 112A, 112B. Furthermore, resistors 306 and 312 each have twice the resistance of each of resistors 106, 108.

In operation, the cross-coupling of the gate and drains of transistors 308A, 308B and 314A, 314B structurally imposes on the biasing circuit 302 the same conditions as in the differential amplifying circuit 101 when at unity gain, in other words when $V_{IN1}$ is equal to $V_{OUT1}$ and $V_{IN2}$ is equal to $V_{OUT2}$. Furthermore, the unbalanced current sources formed by transistors 310 and 316A, 316B, 316C impose current conditions equivalent to a voltage swing of the input voltages $V_{IN1}$ and $V_{IN2}$. For example, in the case that there are three transistors 316A, 316B, 316C, each having the same width as transistor 310, such a circuit is adapted for a current swing in the transistors 102, 104 between $I_{bias} - i_{max}$ and $I_{bias} + i_{max}$, where $I_{bias}$ is the quiescent current present when there is a null differential input signal at the input of the amplifier, for example at 0 V, and $i_{max}$ is the maximum amplitude of the differential current generated by a maximum differential voltage at the input to the differential amplifying circuit, equal in this case to Ibias/2. The operational amplifier 318 generates a voltage at its output that results in the source voltages of transistors 308 and 314 being equal, and when this condition is satisfied, $gm \times R = 1$.

In alternative embodiments, the MOS devices 308, 310, 314 and 316 could comprise a different number of MOS transistors in parallel, and there could also be one or more additional transistors coupled in parallel with transistor 310. Depending on the characteristics of the differential input signal $V_{IN1}$, $V_{IN2}$ at the gates of the differential pair 102, 104, the ratio between the number of transistors 310 and number of transistors of device 316 can be chosen. In general, calling N the ratio $I_{bias}/i_{max}$, the ratio T between the number of transistors of device 316 and the number of transistors 310 in branch 303 is chosen to be equal to:

$$T=(N+1)/(N-1)$$

Thus, assuming N=2, the ratio can be chosen to be 3/1, implying three transistors 316A, 316B and 316C coupled in parallel to form device 316, and one transistor forms device 310. Alternatively, if N=1.5, then T=5/1. In this case, device 316 for example comprises five transistors 316A to 316E. As a further example, if N=4, then T=5/3, and thus again device 316 would comprise five transistors 316A to 316E, and device 310 would comprise three transistors.

Figure 4:
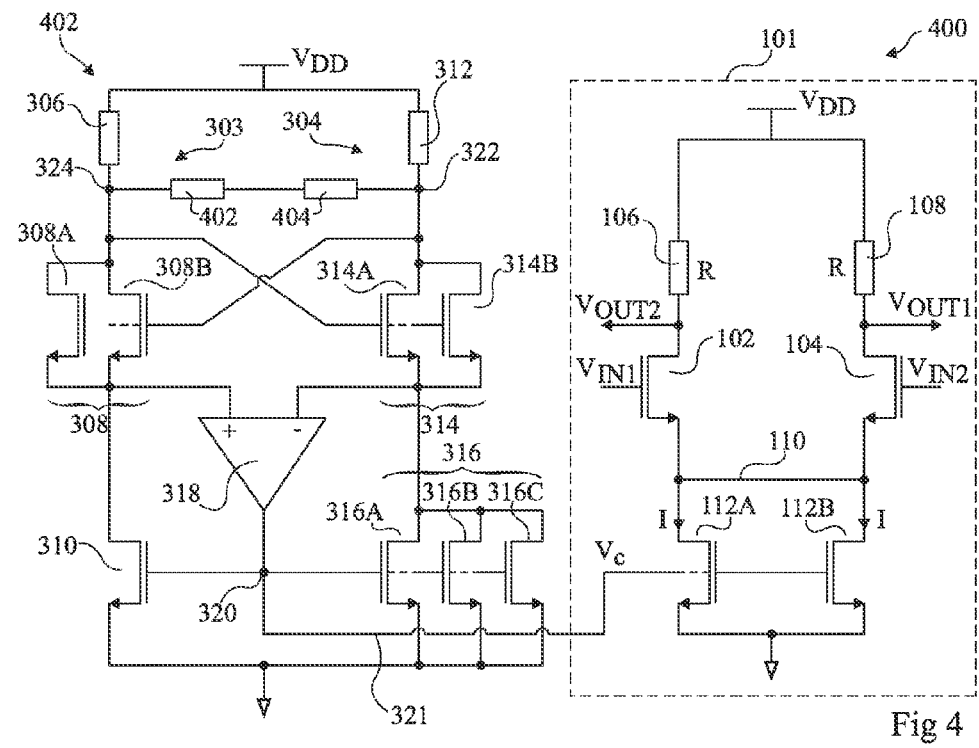

FIG. 4 illustrates a differential amplifier 400, which is very similar to the amplifier 300 of FIG. 3, and like features have been labelled with like reference numerals. However, in amplifier 400, a biasing circuit 402 comprises, compared to biasing circuit 302, an additional pair of resistors 402 and 404 coupled in series between the drains of transistors 308A, 308B and 314A, 314B.

While the circuitry of FIG. 3 is optimized for a unity gain, by the addition of the pair of resistors 402 and 404, the gain of the differential amplifier 400 can be optimized for non-unity conditions. For example, to achieve a four-times gain, each of the resistors 402, 404 for example has a third of the resistance of each the resistors 306 and 312. In general, for a gain of G, and assuming that the resistors 306, 312 each have a resistance R/N, each of the resistors 402, 404 has a resistance equal to (R/N)/(G−1).

It will be apparent to those skilled in the art that the resistors 402, 404 could be combined in a single resistor.

FIG. 5 illustrates a differential amplifier 500 comprising the same biasing circuit 402 as FIG. 4, but comprising an amplifying circuit 501 in which an additional variable resistor 502 is positioned between the sources of transistors 102, 104. Thus, whereas the resistors 402 and 404 of the biasing circuitry 301 are used to determine the upper limit of a possible gain, the resistor 502 can be used to vary this gain below that of the maximum level.

FIG. 6 illustrates an electronic device 600 comprising input means 602 for receiving a differential input signal, provided on lines 604 to a differential amplifier 606A. The amplifier 606A for example comprises the differential amplifier of FIG. 3, 4 or 5, and is thus a fixed or variable gain amplifier. The output of the differential amplifier 606A on line 608 may be coupled to one or more further differential amplifiers 606B also comprising the circuit of FIGS. 3, 4 and 5, and/or coupled to processing circuitry 610, which for example comprises analogue to digital converters, a DSP (digital signal processor) or other such circuitry.

The electronics device 600 is for example a hard disk drive or other device for reading an electronic data medium such as a compact disc, digital versatile disc, magnetic strip, or the like. Alternatively, the electronic device 600 could be a portable electronics device, such as a mobile telephone, laptop computer, portable music or video player, etc. Furthermore, the electronic device could be a set top box, DVD player, personal computer or the like.

An advantage of the embodiments described herein is that variations in the resistance of resistors and the trans-conductance of transistors in the differential amplifying circuit can be accurately compensated. In particular, it has been shown that the magnitude of the output voltage fluctuations caused by such variations can be reduced by a factor of ten when compared to the circuit of FIG. 2.

Furthermore, by providing the resistors 402 and 404, the gain of the differential amplifier can be adjusted to a desired level. Furthermore, by introducing variable resistor 502, the gain of the amplifier can be made to be variable.

While a number of specific embodiments of the present invention have been described, it will be apparent to those skilled in the art that numerous modifications and alterations could be applied.

For example, while in the described embodiments all the transistors are N-channel MOS transistors, it will be apparent to those skilled in the art that these may be replaced by P-channel MOS transistors, and/or bipolar transistors.

Furthermore, while the embodiments have been described having transistors coupled in parallel, equivalent transistor widths could be achieved by providing instead one or more wider transistors. However, the advantage of using multiple transistors coupled in parallel is that they will match more accurately the behaviour of the differential pair 102, 104 and current source 112.

While a ground voltage at 0 V is described in the various embodiments, it will be apparent to those skilled in the art that the ground voltage could be replaced by an alternative supply voltage level, such as a negative voltage. The various features described in relation to the various embodiments can be combined in any combination in alternative embodiments.

What is claimed is:

1. A biasing circuit for controlling the current flowing through a differential pair of a differential amplifying circuit, the biasing circuit comprising:

first and second branches each coupled between first and second supply voltages, the first branch comprising a first resistor, a first transistor device and a second transistor device coupled in series, and the second branch comprising a second resistor, a third transistor device and a fourth transistor device coupled in series, a control node of the third transistor device being coupled to a first node between the first resistor and the first transistor device, and a control node of the first transistor device being coupled to a second node between the second resistor and the third transistor device; and an operational amplifier having a first input coupled to a node between the first and second transistor devices, a second input coupled to a node between the third and fourth transistor devices, and an output node coupled to control nodes of the second and fourth transistor devices, said output node providing an output signal for controlling the current flowing through said differential pair.

2. The biasing circuit of claim 1, wherein the first and third transistor devices each comprise a pair of transistors coupled in parallel.

3. The biasing circuit of claim 2, wherein the transistor of the first and third transistor devices each have the same width as each transistor of said differential pair.

4. The biasing circuit of claim 1, wherein the fourth transistor device comprises a plurality of transistors coupled in parallel with each other, each having the same width as a transistor of a variable current source connected to said differential pair.

5. The biasing circuit of claim 4, wherein the ratio between the number of transistors of said fourth transistor device and of said second transistor device is chosen to equal (N+1)/(N−1), where N is the ratio between a quiescent current and a maximum acceptable signal current.

6. The biasing circuit of claim 5, wherein the ratio between the number of transistors of said fourth transistor device and of said second transistor device is in the range 1 to 20.

7. The biasing circuit of claim 1, further comprising at least one resistor coupled between said first and second nodes.

8. The biasing circuit of claim 1, wherein the fourth transistor device comprises three transistors coupled in parallel with each other, each having a width of the transistors equal to the width of the second transistor device of the first branch.

9. A differential amplifier comprising the biasing circuit of claim 1, and an amplifying circuit comprising:
- a first resistor coupled between the first supply voltage and a first transistor of the differential pair;
- a second resistor coupled between the first supply voltage and a second transistor of the differential pair; and
- a variable current source controlled by said output signal for controlling the current flowing through said differential pair.

10. The differential amplifier of claim 9, wherein the amplifying circuit comprises a first differential output node between the first transistor of the differential pair and the first resistor, and a second differential output node between the second transistor of the differential pair and the second resistor.

11. The differential amplifier of claim 9, wherein the amplifying circuit further comprises a first variable resistor coupled between the sources of the first and second transistors of the differential pair, and wherein the variable current source comprises:
- a first transistor coupled between the source of the first transistor of the differential pair and the second supply voltage; and
- a second transistor coupled between the source of the second transistor of the differential pair and the second supply voltage.

12. A device comprising:
- an input configured to receive an input signal;
- a biasing circuit configured to control a differential pair of a differential amplifier and having:
  - first and second branches each coupled between first and second supply voltages, the first branch comprising a first resistor, a first transistor device and a second transistor device coupled in series, and the second branch comprising a second resistor, a third transistor device and a fourth transistor device coupled in series, a control node of the third transistor device being coupled to a first node between the first resistor and the first transistor device, and a control node of the first transistor device being coupled to a second node between the second resistor and the third transistor device; and
  - an operational amplifier having a first input coupled to a node between the first and second transistor devices, a second input coupled to a node between the third and fourth transistor devices, and an output node coupled to control nodes of the second and fourth transistor devices, said output node providing an output signal for controlling the current flowing through said differential pair;
- said differential amplifier configured to receive and amplify said input signal and having:
  - a first resistor coupled between the first supply voltage and a first transistor of the differential pair;
  - a second resistor coupled between the first supply voltage and a second transistor of the differential pair; and
  - a variable current source controlled by said output signal for controlling the current flowing through said differential pair; and
- an output configured to output said amplified input signal.

13. The device of claim 12 wherein said differential amplifier is a variable gain amplifier (VGA).

14. The device of claim 12 further comprising a disk drive for reading an electronic data storage disk comprising a read head.

15. The device of claim 12 further comprising a plurality of said differential amplifiers coupled in series.

16. An electronic device comprising:
- a differential amplifier having a first input connected to a first node and a second input connected to a second node and having an output driving a variable current signal to a differential pair of a differential amplifier;
- said first node being connected to (i) a first transistor, the first transistor having a first terminal connected to a first supply voltage through a first resistor and (ii) a second transistor having a control terminal connected to said output; and
- said second node being connected to (i) a third transistor, the third transistor having a first terminal connected to the first supply voltage through a second resistor and (ii) a plurality of fourth transistors, each said fourth transistors having a control node connected to said output.

17. The electronic device of claim 16 further comprising:
- a variable current source connected to said differential pair and controlling current flowing through said differential pair, said variable current source controlled by said variable current signal.

18. The electronic device of claim 16 wherein said plurality of fourth transistors comprises three transistors.

19. The electronic device of claim 16 further comprising an input configured to receive a differential input signal and an output configured to output an amplified differential signal.

20. The electronic device of claim 16 further comprising at least one resistor between said first terminal of said first transistor and said first terminal of said third transistor.

\* \* \* \* \*